United States Patent
Schult et al.

(10) Patent No.: US 9,305,731 B2
(45) Date of Patent: Apr. 5, 2016

(54) SUPPLY SYSTEM FOR AN AIRCRAFT, USE OF A SHIELDED SUPPLY LINE IN AN AIRCRAFT AND AN AIRCRAFT WITH A SUPPLY SYSTEM

(71) Applicant: Airbus Operations GmbH, Hamburg (DE)

(72) Inventors: Jens Schult, Stelle (DE); Torsten Stengel, Buxtehude (DE); Nicolas Fouquet, Hamburg (DE)

(73) Assignee: Airbus Operations GmbH (DE)

( * ) Notice: Subject to any disclaimer, the term of this patent is extended or adjusted under 35 U.S.C. 154(b) by 158 days.

(21) Appl. No.: 14/051,580

(22) Filed: Oct. 11, 2013

(65) Prior Publication Data

US 2014/0104732 A1 Apr. 17, 2014

Related U.S. Application Data

(60) Provisional application No. 61/712,292, filed on Oct. 11, 2012.

(30) Foreign Application Priority Data

Oct. 11, 2012 (EP) .................................. 12 188 172

(51) Int. Cl.
*H02H 3/00* (2006.01)
*H02H 9/08* (2006.01)
(Continued)

(52) U.S. Cl.
CPC ................. *H01H 83/02* (2013.01); *H02H 3/16* (2013.01); *H02H 3/28* (2013.01); *G01R 31/008* (2013.01); *G01R 31/025* (2013.01); *H02H 5/10* (2013.01)

(58) Field of Classification Search
CPC ................................. H02H 3/16; H02H 3/162
USPC .......................................................... 361/42
See application file for complete search history.

(56) References Cited

U.S. PATENT DOCUMENTS 4,931,894 A   6/1990 Legatti
5,239,438 A * 8/1993 Echtler ........................... 361/44
(Continued)

FOREIGN PATENT DOCUMENTS

JP   H05 11009 A    1/1993
JP   H05 142290 A   6/1993
(Continued)

OTHER PUBLICATIONS

A.P.Borisov; Publication No. RU 2033675; Publication Date: Apr. 20, 1995; Title: Fault free parallel inverter electric supply protection involves formation of additional current fault signal at parallel inverter output switching off on one of the semicondcutor switches.*

*Primary Examiner* — Dharti Patel
(74) *Attorney, Agent, or Firm* — Lerner, David, Littenberg, Krumholz & Mentlik, LLP

(57) ABSTRACT

A supply system for supplying energy in an aircraft includes at least one electrical line including at least one core connectable to a pole of a current source, an electrically conductive shield, and a detection unit having at least two electrical inputs. The shield surrounds the at least one core under a distance and creates an intermediate space between the at least one core and the shield. At least one port of the detection unit is connected to the at least one core. At least another port of the detection unit is connected to at least one of the shield and the at least one core. The detection unit is adapted for detecting a differential current over the at least one core or an absolute current between the shield and a ground potential for generating a warning signal if a predetermined threshold value for the detected current value is exceeded.

10 Claims, 2 Drawing Sheets

(51) Int. Cl.
*H01H 83/02* (2006.01)
*H02H 3/16* (2006.01)
*H02H 3/28* (2006.01)
*G01R 31/00* (2006.01)
*G01R 31/02* (2006.01)
*H02H 5/10* (2006.01)

(56) References Cited

U.S. PATENT DOCUMENTS

| | | |
|---|---|---|
| 5,612,579 A | 3/1997 | Wisbey et al. |
| 2004/0001292 A1* | 1/2004 | Vanderkolk .................. 361/42 |
| 2004/0070899 A1 | 4/2004 | Gershen et al. |
| 2006/0007610 A1* | 1/2006 | Chan et al. .................. 361/42 |
| 2006/0060690 A1* | 3/2006 | Aisenbrey .................. 244/1 R |
| 2009/0200878 A1 | 8/2009 | Walter |
| 2011/0003227 A1 | 1/2011 | Matsubara |

FOREIGN PATENT DOCUMENTS

| | | |
|---|---|---|
| JP | 2002 198680 A | 7/2002 |
| JP | 2007 305478 A | 11/2007 |

* cited by examiner

SUPPLY SYSTEM FOR AN AIRCRAFT, USE OF A SHIELDED SUPPLY LINE IN AN AIRCRAFT AND AN AIRCRAFT WITH A SUPPLY SYSTEM

CROSS-REFERENCE TO RELATED APPLICATIONS

This application claims and the benefit of the filing date of U.S. Provisional Application No. 61/712,292, filed Oct. 11, 2012, the disclosure of which is hereby incorporated herein by reference.

TECHNICAL FIELD

The invention relates to a supply system for an aircraft, the use of a shielded electrical line in an aircraft and an aircraft with a supply system.

BACKGROUND OF THE INVENTION

The delivery of electrical energy as well as of operating supplies to individual systems in a vehicle is usually accomplished through one or more supply systems having electrical and fluid lines. In a modern aircraft, for example, a plurality of electrical networks is present, which may provide direct and/or alternating current to electrical loads. In direct current networks heavy input filters and rectifiers commonly used in alternating current circuits may be avoided, especially in high voltage direct current networks. Fuel cells, that tend to become more important in future aircraft applications, may deliver such a high voltage direct current directly.

Electrical loads, for example fans, pumps or compressors that are to be driven by a high voltage direct current supplied by a fuel cell will most likely be placed remotely from the fuel cell. It may therefore be necessary to deliver the current through electrical lines that extend from the fuel cell to these remote locations and that are traditionally protected against an overcurrent. As a safety measure, a common design requirement defines placing lines with flammable fluids under a given safety distance to electrical lines.

BRIEF SUMMARY OF THE INVENTION

An aspect of the invention provides a supply system for a vehicle that allows an improved use of installation space and especially smaller distances between electrical lines and fluid lines, without a loss of safety.

Arcing effects may develop for extended periods of time. This may particularly be the case for direct current systems as an arc is not extinguished by a sine wave commutation, which is found in alternating current systems. As the minimum current necessary for sustaining an arcing event may be quite low, there may be a certain discrepancy to given trip limits in common circuit breaker arrangements designed for short-circuits. Depending on the duration of the arcing effect the temperature may be locally increased in the concerning electrical line. The segregation distance between electrical lines and lines for flammable fluids may therefore be reduced by drastically improving the detectability of arcing events.

An advantageous embodiment of a supply system for supplying energy in an aircraft according to an embodiment of the invention comprises at least one electrical line connectable to a current source, an electrically conductive shield and a detection unit having at least two electrical inputs. The at least one electrical line comprises at least one core connectable to a pole of the current source, wherein the shield surrounds the at least one core under a distance and creates an intermediate space between the at least one core and the shield. At least one port of the detection unit is connected to the at least one core. Said detection unit is adapted for detecting a differential current over the at least one core or an absolute current between two of the shield, the at least one core and a ground potential; and wherein said detection unit is adapted for generating a warning signal if a predetermined threshold value for the detected current value is exceeded.

Accordingly, the supply system constitutes a main component for an electrical network that is able to automatically detect a number of electrical failures such as arcing, short circuits or a breakdown of an isolation, especially in a direct current environment. In the supply system according to an embodiment of the invention a traditional protection device is therefore not necessary for the protection of the electric network or the electrical loads in these failure cases and, furthermore, the reaction time for e.g. opening the affected electrical circuit is clearly below the common trip time of a traditional protection device. The supply system according to an embodiment of the invention reduces the danger of an increased temperature due to a constant arcing effect that may harm the isolation of the respective electrical network, surrounding fluid lines or other installations and that may increase the probability of an ignition of any flammable fluids in the direct vicinity.

The at least one electrical line of the supply system is responsible for delivering a current to various electrical loads. Thereby, the cross-sectional area of the core of the electrical line is dimensioned for providing an adequate conductivity and an economically feasible resistance according to common methods. The shield may be of any suitable material and shape as long as it is electrically conductive. For example, the shield may be realized by means of a braid, a sock or a tube, that is preferably manufactured from a metallic material or a material that is partially metallic or otherwise conductive and that preferably completely surrounds the at least one core. The intermediate space may either be left empty or, preferably, may at least partially be filled with an electrically isolating material.

The detection unit may be an electronics unit that comprises means for detecting and measuring, respectively, a current as well as a means for comparing the detected and measured, respectively, current to a predetermined threshold value. For example, the detection unit may comprise a passive component, such as a transducer or transformer, for generating a signal that depends on a current value. As an alternative is may comprise active means, such as a calculating unit, for comparing a measured current value and the predetermined threshold value. Depending on the desired design of the electrical line the detection unit comprises a number of ports. Preferably, the number of ports correlates to the number of cores of the electrical line, but may also be less or more, depending on whether the shield is connected to a ground terminal or whether a number of cores are interconnected for achieving a certain level of redundancy. The warning signal that is generated by the detection unit may be fed into a means for opening the affected electrical circuit, for example a switch between an electrical current source and an electrical line, or a core of an electrical line, respectively. The warning signal may furthermore be used to signalize an electric failure or incident, e.g. in a cockpit of an aircraft, or the warning signal may be fed into a maintenance system or into an electronic logbook in order for generating or altering a maintenance schedule.

The invention especially enables the integration of electrical supply lines for auxiliary drives in the vicinity to hydrogen containing systems, container and piping in a vehicle and preferably an aircraft. This may lead to a reduction of weight and an improvement of maintenance access. The combined protection against short circuit as well as arcing or breakdown of isolation provides a higher safety level. Unintended failure currents into structure may thereby be prevented. This may be especially important for application in aircraft with fuselage parts made from a carbon fiber reinforced composite where even little ground currents may lead to structural damages when loose and chaffed harnesses get in contact to the surface of the relevant parts.

In an exemplary embodiment, the supply system comprises at least one switch for interrupting at least one of the at least one core, wherein the detection unit is coupled with the at least one switch such that the switch is triggered by a generated warning signal. As soon as the detection unit detects a current value that exceeds a predetermined threshold value for the tolerable current value, generating the signal alone will generate an awareness for an unwanted situation. In order to consider this generated signal as a failure, it is feasible to interrupt the electrical current delivered through the at least one electrical line. For this purpose, a switch is located in at least one of the at least one core and is coupled with the detection unit. The detection unit is thereby adapted for triggering the switch by generating the warning signal. Preferably, the switch is adapted for interrupting the electrical connection of all cores existing in the electrical line. By this measure the supply system automatically protects itself and the aircraft in which it may be installed against elevated temperatures and a potential danger.

In another exemplary embodiment a first port of the detection unit is connected to the at least one core at a first longitudinal position and a second port of the detection unit is connected to the same core at a second longitudinal position. Said detection unit is adapted for detecting a differential current between the first port and the second port. Usually, if a current is delivered through a single core of an electrical line the same current that enters the core should exit the core, unless a fraction of the current flows off due to arcing or a short circuit. Connecting two ports of the detection unit to two distanced positions of the core may reveal such a failure. Preferably, the two ports of the detection unit detect a differential current that occurs between two distanced positions, e.g. two ends, of the core between a first end in a region of an electrical current source and a second end in the region of an electrical load to be supplied with the electrical current. As a result substantially the complete active length of the electrical line is monitored for any fraction of the current that is lost over the length of the core.

In a further advantageous embodiment, the supply system comprises a ground terminal, wherein the at least one electrical line comprises at least two cores, wherein a first core is connectable to a positive pole of an electrical current source, wherein a second core is connectable to a negative pole and wherein the shield is connectable to the ground terminal. One port of the detection unit is connected to at least one of the cores and another port of the detection unit to the ground terminal. Such a supply system may support the use of a two-wired transfer of a direct current. As soon as a current between one of the cores and the ground terminal occurs, the detection unit generates a signal and may switch off at least one of the cores, for example the core connected to the positive pole.

In another advantageous embodiment the at least one electrical line of the supply system comprises at least two cores, wherein a first core is connectable to a positive pole of an electrical current source and wherein a second core is connectable to a negative pole. The detection unit is coupled to the two cores for detecting a total current over the two cores. For example, especially when the current is an alternating current, this may be conducted by a summation current transformer that encloses the two cores without directly contacting the cores. In an ideal case, wherein one core delivers the current in one direction and the other core into the other direction, the sum of the currents in both directions equals zero. In case less current returns than has been delivered, leading to a current sum different than zero, a fraction of the current has flown off. If the current detected by the summation current transformer exceeds a predetermined threshold value, the detection unit generates a warning signal. In case the current is a direct current, instead of a summation current transformer individual current transducers or other suitable detection/measurement tools may be used.

In a still further advantageous embodiment, the at least one electrical line comprises three cores for transferring an alternating current with three phases, wherein the detection unit comprises three ports each connected to one of the at least three cores. The detection unit thereby comprises a summation transformer for detecting a sum over the effective currents of all cores.

In a still further advantageous embodiment the supply system comprises a source of electrical current connected to the at least one electrical line. The supply system therefore encloses generators, batteries, electrochemical converters and other sources of power that may deliver any kind of electrical current.

In an advantageous embodiment the source of electrical current is a direct current source. As mentioned above, heavy inverters, filters and other peripheral equipment may be eliminated for operating various electrical loads. Especially in a direct current environment the supply system according to the invention has great advantages over common systems as reliably arcing effects may be discovered and the danger potential for lines carrying flammable fluids is greatly reduced.

In a still further advantageous embodiment the source of electrical current comprises a fuel cell with at least one hydrogen line arranged adjacent to the at least one electrical line for providing hydrogen to the fuel cell. As the fuel cell depends on a hydrogen supply the segregation distance between the hydrogen line and the electrical line may be clearly reduced in the supply system according to the invention. Thereby, installation space and weight can be saved.

Besides the use of a fuel cell supplied by hydrogen via hydrogen lines also other fluid lines may be installed in a direct vicinity of electrical lines in an aircraft. These fluid lines may require a segregation distance to the electrical lines if they carry flammable or oxidizing substances, such as fuel, oil or oxygen. By using the invention, the segregation distance or safety clearance between the hydrogen line and the at least one electrical line may be minimized.

In another embodiment, the hydrogen supply line comprises an electrically conducting material and is connected to a ground terminal. The shield of the electrical line and the material of the hydrogen supply line are connected to the same electrical reference, thus an arcing reaction may be clearly prevented.

Still further, in the supply system according to the invention the source of electrical current may also be an alternating current source. This may be an option or an addition to a direct current supply system, wherein the level of protection is clearly increased compared to common supply systems.

The invention further relates to an aircraft comprising at least one electrical load and a supply system according to the description above.

The invention still further relates to the use of a shield surrounding at least one core of an electrical line under a distance and under creation of an intermediate space between the at least one core and the shield; and a detection unit with at least two ports for detecting a differential current over the at least one core or an absolute current between two of the shield, the at least one core and a ground potential for detecting a failure current of the electrical line.

The invention also relates to a method for protecting a supply system in an aircraft, comprising the steps of a) providing a supply system with at least one electrical line connectable to a current source, an electrically conductive shield, and a detection unit having at least two electrical inputs, wherein the at least one electrical line comprises at least one core connectable to a pole of the current source, wherein the shield surrounds the at least one core under a distance and creates an intermediate space between the at least one core and the shield, wherein at least one port of the detection unit is connected to the at least one core and wherein at least another port of the detection unit is connected to at least one of the shield and the at least one first core, b) detecting a differential current over the at least one core or an absolute current between the shield and a ground potential and c) generating a warning signal if a predetermined threshold value for the detected current value is exceeded.

BRIEF DESCRIPTION OF THE DRAWINGS

Further characteristics, advantages and application options of the present invention are disclosed in the following description of the exemplary embodiments in the figures. All the described and/or illustrated characteristics per se and in any combination form the subject of the invention, even irrespective of their composition in the individual claims or their interrelationships. Furthermore, identical or similar components in the figures have the same reference characters.

DETAILED DESCRIPTION

Figure 1A:
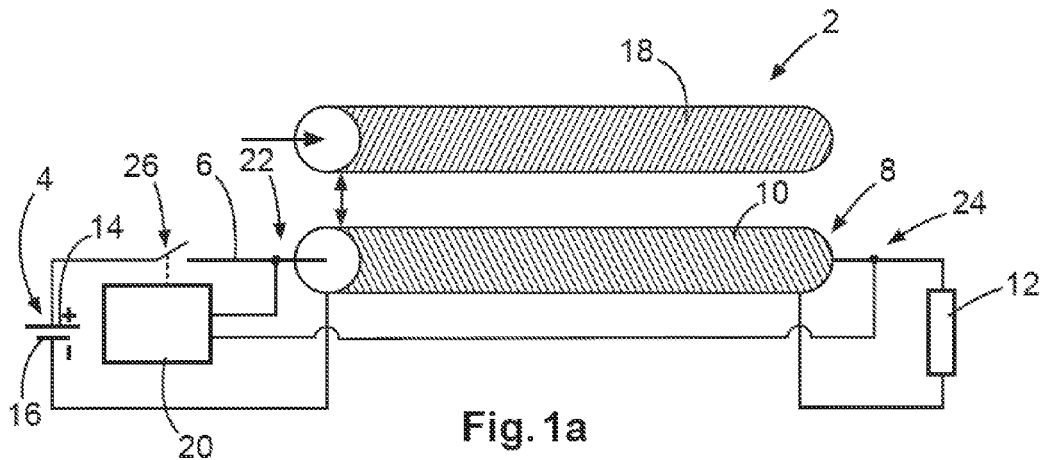
FIG. 1a to 1c show a supply system in schematic, block-oriented views.

FIG. 1a shows an exemplary supply system 2 according to an embodiment of the invention comprising an electrical direct current source 4 connected to a core 6 of an electrical line 8 that is surrounded by a shield 10 and further connected to an electrical load 12. While the core 6 is connected to a positive pole 14 of the electrical current source 4, the shield 10 is connected to a negative pole 16. The electrical load 12 may be located in a clear distance to the electrical current source 4 such that the electrical line 8 extends over a clear distance.

The electrical current source 4 may be realized as a fuel cell, which depends on the supply of hydrogen and an oxidant. Hydrogen may be supplied by a hydrogen line 18 that may extend parallel to the electrical line 8. Commonly a segregation distance between a hydrogen line or any other line that delivers a flammable fluid is at least 150 mm in order to prevent the supply of heat from the electrical line 8 to the hydrogen line 18 in case of arcing, a short-circuit or other failure cases. According to an embodiment of the invention, arcing effects are limited to the intermediate space between the core 6 and the shield 10. Furthermore, a detection unit 20 is provided that detects a differential current between a first end 22 and a second end 24 of the core 6. The detection unit 20 is further adapted to compare this detected differential current value with a predetermined threshold value and to generate a warning signal if the differential current exceeds the predetermined threshold value. Thereby, any parasitic flow of a current due to an arcing effect is detected as not the complete current is delivered from the first end 22 to the second end 24. The warning signal may further be used to trigger a switch 26 that interrupts the connection between the positive pole 14 and the core 6. By this measure a very quick protection apparatus is provided for reliably protecting the supply system 2.

Figure 1B:
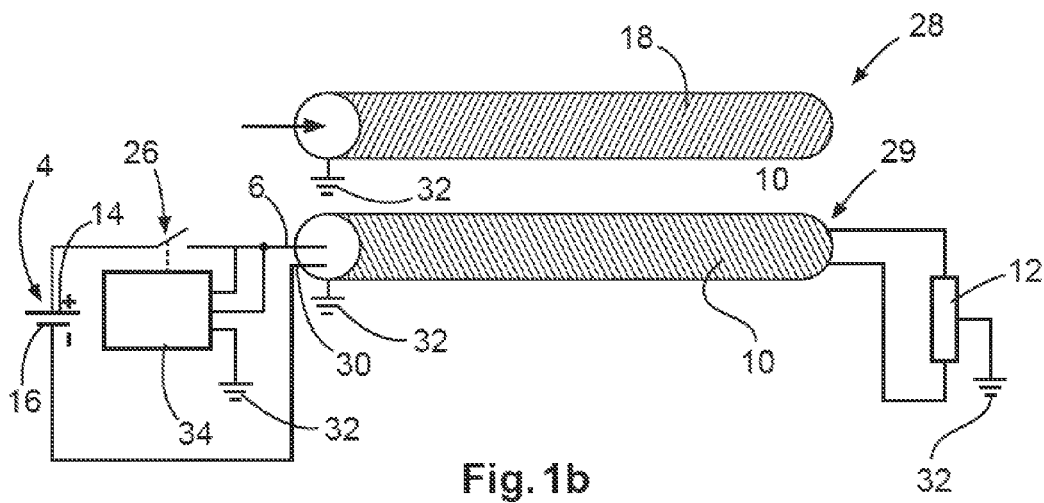

In another exemplary embodiment according to FIG. 1b, a supply system 28 is shown with basically the same components as shown in FIG. 1a but the use of two cores 6 and 30 in an electrical line 29. One of the cores, core 6, is, again, connected to the positive pole 14 while the other pole, core 30, is connected to the negative pole 16. The shield 10 as well as the hydrogen line 18 are connected to a ground terminal 32. The detection unit 34 is connected to the core 6 in its first position 22 as well as to the ground terminal 32. If a current between the core 6 and the ground terminal 32 occurs then the detection unit 34 may generate a warning signal and, furthermore, may trigger the switch 26 to interrupt the connection between the positive pole 14 and the core 6.

Figure 1C:
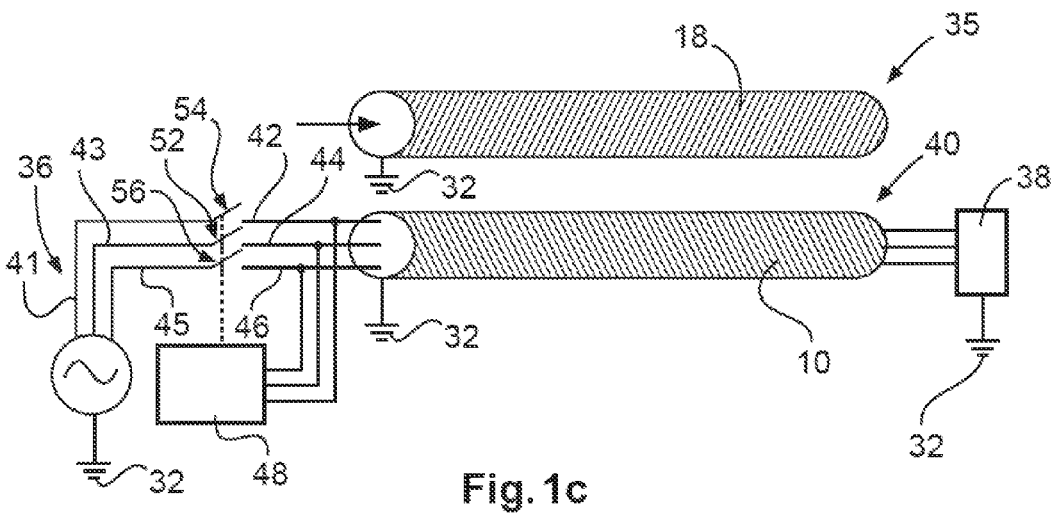

FIG. 1c shows a supply system 35 in which the transfer of an alternating current from an alternating current source 36 to an electrical load 38 is conducted through an electrical line 40 that comprises three cores 42, 44 and 46, wherein each of the cores is connected to one phase 41, 43 and 45 of the alternating current source 36. A detection unit 48 is furthermore connected to a first end 50 of all of the cores 42 to 46 and detects a difference of all effective currents. If the difference of all of the effective currents exceeds a threshold value, a warning signal is generated. This warning signal may trigger switches 52 to 56 in order to interrupt the connection between the alternating current source 36 and the cores 42 to 46.

Figure 2:
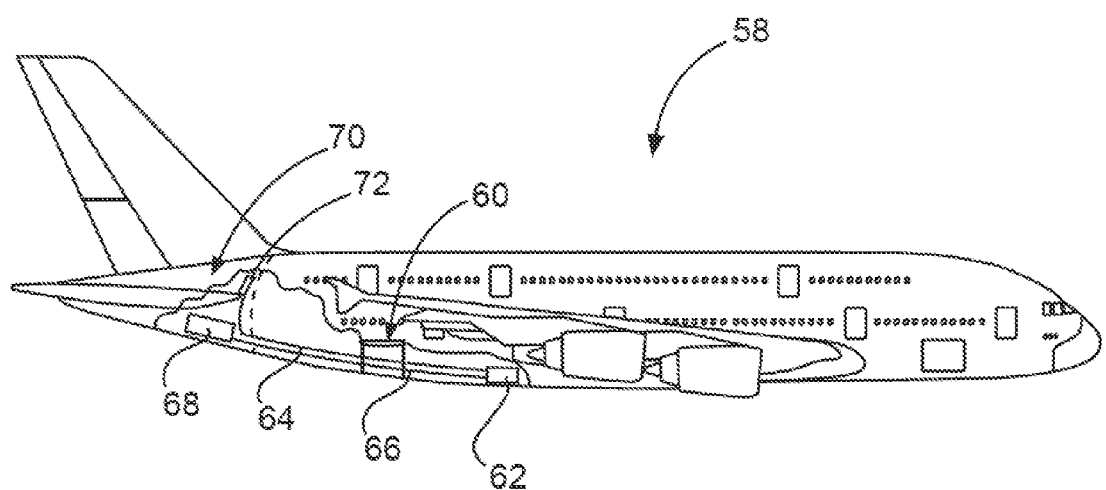
FIG. 2 shows an aircraft having a fuel cell and a supply system according to the invention.

FIG. 2 shows an aircraft 58 having a supply system 60 comprising a fuel cell 62, at least one electrical line 64 and at least one hydrogen line 66 extending to a hydrogen tank 68 located in a tail cone 70 of the aircraft. The fuel cell 62 is supplied with hydrogen from the hydrogen tank 68 and delivers electrical power through the electrical line 64 to an electrical load 72. The segregation distance between the hydrogen line 66 and the electrical line 64 may be clearly reduced comparing to known systems as the supply system 60 according to the invention provides a clearly improved warning and protection mechanism.

Currently the development of electrical aircraft power distribution systems tend to the use of direct current with a voltage from 270V to 560V. The advantage of such high voltage DC systems is the deletion of heavy input filters and rectifier arrangements necessary in conventional electrical loads such as fans, pumps or other drives because the inverters of those units will be supplied directly out of a DC bus bar. As the internal bus system of the fuel cell 62 already delivers a high voltage direct current it is advantageous to use rather this supply for larger auxiliary drives such as fans, pumps or compressors than converting the delivered current into an alternating current and back to a direct current directly at the respective electrical load. These loads, as indicated in FIG. 2, will most likely be positioned in a remote location relative to the fuel cell 62. Through the supply of electrical current by means of the supply system according to an embodiment of the invention arcing or short circuits may not develop for longer periods of time. Therefore, no considerable amount of thermal energy to the surrounding environment is created as the arcing event is reliably detected by the detection unit. Adjacent hydrogen lines 66 are not heated up through any arcing event, therefore catastrophic failures inside the aircraft are reliably prevented in this regard, even if the segregation distance is clearly reduced.

In addition, it should be pointed out that "comprising" does not exclude other elements or steps, and "a" or "an" does not exclude a plural number. Furthermore, it should be pointed out that characteristics or steps which have been described with reference to one of the above exemplary embodiments can also be used in combination with other characteristics or steps of other exemplary embodiments described above. Reference characters in the claims are not to be interpreted as limitations.

The invention claimed is:

1. A supply system for supplying energy in an aircraft, the supply system comprising:
    at least one electrical line,
    a source of direct electrical current connected to the at least one electrical line,
    an electrically conductive shield, and
    a detection unit having at least first and second electrical inputs,
    wherein the at least one electrical line comprises at least one core connectable to a pole of the current source,
    wherein the shield surrounds the at least one core under a distance and creates an intermediate space between the at least one core and the shield,
    wherein at least one port of the detection unit is connected to the at least one core,
    wherein said detection unit is adapted for detecting a differential current over the at least one core or an absolute current between two of the shield, the at least one core and a ground potential;
    wherein said detection unit is adapted for generating a warning signal if a predetermined threshold value for the detected current value is exceeded; and
    wherein the detection unit is coupled with at least one switch in the at least one core for interrupting the current transferred by the at least one core if the warning signal is generated.

2. The supply system according to claim 1, wherein a first port of the detection unit is connected to the at least one core at a first longitudinal position and wherein a second port of the detection unit is connected to the same core at a second longitudinal position; and
    wherein said detection unit is adapted for detecting a differential current between the first port and the second port.

3. The supply system according to claim 1, further comprising a ground terminal,
    wherein the at least one electrical line comprises at least first and second cores,
    wherein the first core is connectable to a positive pole, the second core is connectable to a negative pole and the shield is connectable to the ground terminal; and
    wherein one port of the detection unit is connected to at least one of the first and second cores and another port of the detection unit to the ground terminal.

4. The supply system according to claim 1, wherein the at least one electrical line comprises at least first, second, and third cores for transferring an alternating current with three phases,
    wherein the detection unit comprises first, second, and third ports each connected to one of the at least first, second, and third cores, and
    wherein the detection unit comprises a summation transformer for detecting a sum over the effective currents of all cores.

5. The supply system according to claim 1, wherein the source of electrical current comprises a fuel cell with at least one hydrogen line arranged adjacent to the at least one electrical line for providing hydrogen to the fuel cell.

6. The supply system according to claim 5, wherein the hydrogen line comprises an electrically conducting material and is connected to a ground terminal.

7. The supply system according to claim 1, wherein the source of electrical current is an alternating current source.

8. An aircraft, comprising at least one electrical load and a supply system, the supply system comprising:
    at least one electrical line,
    a source of direct electrical current connected to the at least one electrical line,
    an electrically conductive shield, and
    a detection unit having at least first and second electrical inputs,
    wherein the at least one electrical line comprises at least one core connectable to a pole of the current source,
    wherein the shield surrounds the at least one core under a distance and creates an intermediate space between the at least one core and the shield,
    wherein at least one port of the detection unit is connected to the at least one core,
    wherein said detection unit is adapted for detecting a differential current over the at least one core or an absolute current between two of the shield, the at least one core and a ground potential;
    wherein said detection unit is adapted for generating a warning signal if a predetermined threshold value for the detected current value is exceeded; and
    wherein the detection unit is coupled with at least one switch in the at least one core for interrupting the current transferred by the at least one core if the warning signal is generated.

9. The aircraft according to claim 8, comprising a fuselage at least partially made from a carbon fiber reinforced material.

10. A method for protecting a supply system in an aircraft, comprising the steps of:
    providing a supply system with
        at least one electrical line connected to a direct current source,
        an electrically conductive shield, and
        a detection unit having at least two electrical inputs,
        wherein the at least one electrical line comprises at least one core connectable to a pole of the current source,
    wherein the shield surrounds the at least one core under a distance and creates an intermediate space between the at least one core and the shield,
    wherein at least one port of the detection unit is connected to the at least one core and wherein at least another port of the detection unit is connected to at least one of the shield and the at least one first core,
    detecting a differential current over the at least one core or an absolute current between the shield and a ground potential;
    generating a warning signal if a predetermined threshold value for the detected current value is exceeded; and
    interrupting the current transferred by the at least one core if the warning signal is generated by at least one switch in the at least one core.

* * * * *